(12) United States Patent
Thayer

(10) Patent No.: US 8,634,221 B2
(45) Date of Patent: Jan. 21, 2014

(54) MEMORY SYSTEM THAT UTILIZES A WIDE INPUT/OUTPUT (I/O) INTERFACE TO INTERFACE MEMORY STORAGE WITH AN INTERPOSER AND THAT UTILIZES A SERDES INTERFACE TO INTERFACE A MEMORY CONTROLLER WITH AN INTEGRATED CIRCUIT, AND A METHOD

(75) Inventor: Larry J. Thayer, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 197 days.

(21) Appl. No.: 13/286,338

(22) Filed: Nov. 1, 2011

(65) Prior Publication Data

US 2013/0111123 A1  May 2, 2013

(51) Int. Cl.
*G11C 5/04* (2006.01)

(52) U.S. Cl.
USPC .................................. 365/52; 365/51; 365/63

(58) Field of Classification Search
USPC ......................................... 365/219, 220, 221
See application file for complete search history.

(56) References Cited

U.S. PATENT DOCUMENTS

| | | | |
|---|---|---|---|
| 6,304,502 B1 * | 10/2001 | Watanabe et al. | 365/201 |
| 6,584,004 B2 * | 6/2003 | Kanekawa et al. | 365/51 |
| 7,089,379 B1 * | 8/2006 | Sharma et al. | 711/154 |
| 7,834,450 B2 * | 11/2010 | Kang | 257/724 |
| 8,218,347 B1 * | 7/2012 | Law et al. | 365/63 |
| 2011/0161544 A1 | 6/2011 | Chengson et al. | |

FOREIGN PATENT DOCUMENTS

| KR | 100684890 B1 | 2/2007 |
|---|---|---|
| KR | 20070059735 A | 6/2007 |

OTHER PUBLICATIONS

Pradeep Chakraborty, Avago debuts 28-nm ASIC embedded SerDes with industry-leading 30-Gbps performance, PC's Semiconductors Blog, Jan. 31, 2011.
Richard Goering, Wide I/O Memory and 3D ICs—A New Dimension for Mobile Devices, Cadence.com Community Blog, Mar. 28, 2011, Industry Insight.
Bryan Casper, Reinventing DRAM with the Hybird Memory Cube, Intel Blog, Sep. 15, 2011.
Future High Bandwidth Memory TG, Item# 1797.00, TG42_1:TG Report, JEDEC, Global Standards For The Microelectronics Industry, Vancouver, Canada Meeting Jun. 2011.

* cited by examiner

*Primary Examiner* — Tan T. NGuyen

(57) ABSTRACT

A memory system is provided in which at least one DRAM chip and a memory controller chip are mounted in a side-by-side relationship on an interposer. The DRAM chip is connected to the interposer via a Wide I/O interface to enable the DRAM chip and the memory controller chip to communicate with each other via the Wide I/O interface. The memory controller chip has a SerDes interface for communicating with a SerDes interface of an integrated circuit (IC) chip of the memory system.

25 Claims, 3 Drawing Sheets

MEMORY SYSTEM THAT UTILIZES A WIDE INPUT/OUTPUT (I/O) INTERFACE TO INTERFACE MEMORY STORAGE WITH AN INTERPOSER AND THAT UTILIZES A SERDES INTERFACE TO INTERFACE A MEMORY CONTROLLER WITH AN INTEGRATED CIRCUIT, AND A METHOD

TECHNICAL FIELD OF THE INVENTION

The invention relates to memory systems. More particularly, the invention relates to a memory system that employs a wide input/output (I/O) interface in conjunction with an interposer for interfacing memory elements of the system with a memory controller of the system and that utilizes a serializer/deserializer (SerDes) interface for interfacing the memory controller with an integrated circuit (IC) chip of the memory system.

BACKGROUND OF THE INVENTION

Dynamic Random Access Memory (DRAM) chips are used to store instructions and data that are used by processors to perform operations in computer systems. In a typical computer system, a processor, such as a microprocessor, communicates with a memory controller that reads and writes the DRAM cells of one or more DRAM chips in order to retrieve information stored in the DRAM chips and store information in the DRAM chips.

DRAM technology is continuously evolving in ways that increase the storage density of the DRAM chips, decrease the latency associated with writing and reading the DRAM chips, increase the bandwidth associated with memory accesses, decrease the power consumption of the DRAM chips, decrease the weight and form factor of the DRAM chips, and decrease the costs of the DRAM chips.

Joint Electron Devices Engineering Council (JEDEC) is a trade and standardization organization that develops standards for semiconductor devices, including DRAM chips. Over the years, JEDEC has developed many standards for DRAM chips including various double data rate (DDR) standards that improve performance, decrease power consumption, and improve packaging.

Recently, JEDEC developed a DRAM standard for a technology known as Wide I/O, which purportedly is a breakthrough technology that will greatly improve performance, bandwidth, latency, power consumption, packaging, and form factor. The Wide I/O standard calls for stacking DRAM chips and using Through-Silicon Via (STV) technology to interconnect the SDRAM chips with each other and with logic on which the chips are stacked. The resulting memory stack has a 512-bit wide interface.

While the proposed Wide I/O stacked configuration has many advantages, it also has some disadvantages. The logic on which the DRAM chips are stacked comprises a system on a chip (SOC). The SOC generates a relatively large amount of heat that needs to be dissipated so that its performance is not detrimentally impacted. With current Wide I/O proposals, the heat sink structure is disposed on top of the uppermost DRAM chip of the stack. In such cases, the DRAM chips will act as insulators that prevent heat from being efficiently conducted from the SOC into the heat sink structure.

A need exists for a memory system that utilizes certain features of Wide I/O in order to obtain the associated benefits, but that also overcomes the aforementioned heat dissipation problems.

SUMMARY OF THE INVENTION

The invention is directed to a memory system and a method of storing data in a memory system. The memory system comprises a circuit board, a package, an interposer, a memory controller chip, at least a first DRAM chip, and an IC chip. The package is mounted on an upper surface of the circuit board and is electrically interconnected with the circuit board. The interposer is mounted on an upper surface of the package and is electrically interconnected with the package. The first DRAM chip is mounted on an upper surface of the interposer and is electrically interconnected with the interposer. The memory controller chip is mounted on the upper surface of the interposer and is electrically interconnected with the interposer. The memory controller chip and the first DRAM chip are electrically interconnected with each other via the interposer. The electrical interconnection between the first DRAM chip and the interposer and the electrical interconnection between the memory controller chip and the interposer provide a first Wide I/O interface between the first DRAM chip and the memory controller chip. The first Wide I/O interface has a bit width that is equal to or greater than 256 bits.

The IC chip is mounted on and electrically interconnected with the circuit board. A serializer/deserializer (SerDes) interface interconnects the IC chip with the memory controller chip via the circuit board to allow the IC chip and the memory controller chip to communicate with each other via the SerDes interface. The IC chip comprises a first portion of the SerDes interface and the memory controller chip comprises a second portion of the SerDes interface. The first and second portions of the SerDes interface are electrically coupled to each other via electrical conductors of the circuit board.

These and other features and advantages of the invention will become apparent from the following description, drawings and claims.

DETAILED DESCRIPTION OF AN ILLUSTRATIVE EMBODIMENT

Figure 1:
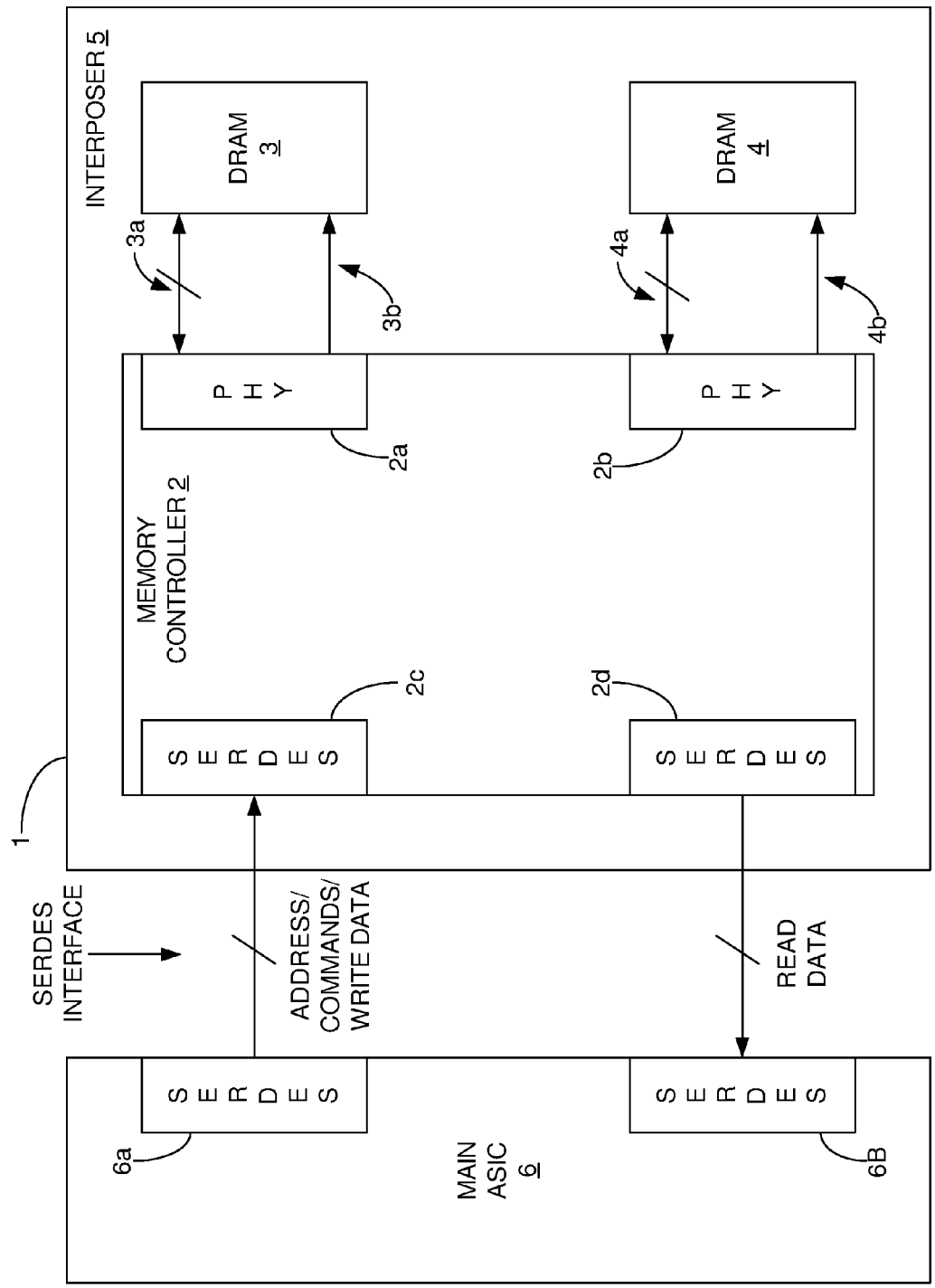
FIG. 1 is a block diagram of the memory system in accordance with an illustrative embodiment.

In accordance with the invention, a memory system is provided in which at least one DRAM chip and a memory controller chip are mounted in a side-by-side relationship on an interposer. The DRAM chip is connected to the interposer via a Wide I/O interface to enable the DRAM chip and the memory controller chip to communicate with each other via the Wide I/O interface. The memory controller chip has a SerDes interface for communicating with a SerDes interface of an integrated circuit (IC) chip of the memory system.

One of the advantages of using the interposer is that it allows the DRAM chip and the memory controller chip to be placed in a side-by-side configuration rather than in a stacked configuration. The side-by-side configuration allows a heat sink structure to be disposed directly on top of the memory controller chip so that heat generated by the memory controller chip passes directly into the heat sink structure rather than into the DRAM chip, as in the aforementioned proposed stacked Wide I/O configuration. Consequently, the memory system has better heat dissipation characteristics than the aforementioned proposed stacked Wide I/O configuration. In addition, because the connection between the DRAM chip and the interposer is a Wide I/O connection, the latency, bandwidth, performance, and power consumption benefits associated with the proposed JEDEC Wide I/O standard are achievable by the memory system.

The SerDes interface between the memory controller chip and the IC chip allows large amounts of data to be communicated at high speed between the memory controller chip and the IC chip using only a few pins than would otherwise be required if a parallel interface were to be used for this purpose. Because the SerDes interfaces use only a few pins on the IC chip, the pin count of the IC chip can be kept relatively low while still allowing a relatively high bandwidth to be achieved between the memory controller chip and the IC chip. In addition, the SerDes interface is a relatively low-power interface. By employing the SerDes interface and the Wide I/O interface together in the same memory system, the amount of power consumed by the memory system is kept relatively low while the speed with which data is written to and read from the memory system by the IC chip is very high. Illustrative or exemplary embodiments of the invention will now be described with reference to the figures, in which like reference numerals represent like elements or components.

FIG. 1 is a block diagram of the memory system 1 in accordance with an illustrative embodiment. A memory controller chip 2 and first and second DRAM chips 3 and 4 are mounted on an interposer 5. Each of the DRAM chips 3 and 4 is interconnected with the interposer 5 by a 512-bit wide I/O interface 3a and 4a. In accordance with an illustrative embodiment, each of these 512-bit wide I/O interfaces 3a and 4a is a Wide I/O interface that complies with the proposed JEDEC Wide I/O interface standard JC-42.6, which explicitly calls for a 512-bit wide interface. Each of these interfaces comprises physical connections between 512 DRAM cells (not shown) of the respective DRAM chip 3 or 4 and respective I/O ports of the memory controller chip 2. The term "Wide I/O interface", as that term is used herein, is intended to denote an interface that has a very large bit width, i.e., at least 256 bits. Thus, the term "Wide I/O interface," as that term is used herein, includes, but is not limited to, Wide I/O interfaces that meet the proposed JEDEC Wide I/O standard JC-42.6.

Using large bit widths for the connections 3a and 4a allows a large number of DRAM cells in the DRAM chips 3 and 4 to be written or read simultaneously using a relatively low frequency clock (i.e., on the order of megabits per second (Mbps)) while still achieving a very high bandwidth. In addition, using the low frequency clock for the Wide I/O interface allows the power consumption requirements of the interface to be kept relatively low. For example, assuming that each DRAM chip 3 and 4 is being clocked at a speed of 200 Mbps, the Wide I/O interface will have a shared read/write bandwidth of 200 Mbps×1024 bits=204.8 gigabits per second (Gbps) and a power consumption of about 500 milliwatt (mW). These interconnections 3a and 4a are typically made by using microbumps (not shown for purposes of clarity) to interconnect pads (not shown for purposes of clarity) disposed on a top surface of the interposer 5 with respective pads (not shown for purposes of clarity) disposed on a bottom surface of the DRAM chips 3 and 4. The memory controller chip 2 is interconnected with the interposer 5 by a similar configuration. These interconnections are described below in more detail with reference to FIG. 2.

The memory controller chip 2 has first and second physical (PHY) interfaces 2a and 2b, respectively, for communicating with the first and second DRAM chips 3 and 4, respectively. The PHY interface 2a includes a first set of physical connections to the interposer 5 that provide part of the Wide I/O interface 3a and a second set of physical connections to the interposer 5 that provide part of a channel 3b for sending commands and addresses from the memory controller chip 2 to the DRAM chip 3. Likewise, The PHY interface 2b includes a first set of physical connections to the interposer 5 that provide part of the Wide I/O interface 4a and a second set of physical connections to the interposer 5 that provide part of a channel 4b for sending commands and addresses from the memory controller chip 2 to the DRAM chip 4. These physical connections are described below in more detail with reference to FIG. 2.

The memory system 1 employs a SerDes interface between the memory controller chip 2 and the IC chip 6. The SerDes interface has a first portion located on the IC chip 6 and a second portion located on the memory controller chip 2. The interface portion on the memory controller chip 2 includes first and second SerDes interfaces 2c and 2d, respectively. The interface portion on the IC chip 6 includes first and second SerDes interfaces 6a and 6b, respectively. The interfaces 2c and 2d communicate with the interfaces 6a and 6b, respectively. The IC chip 6 may be, for example, an application specific integrated circuit (ASIC) chip. For exemplary purposes, it will be assumed hereinafter that the IC chip 6 is an ASIC chip. It is generally desirable to maintain a low pin count in ASIC chips. Using the SerDes interfaces 2c, 2d, 6a, and 6b allows the pin count of the ASIC chip 6 to be kept low without sacrificing bandwidth. Additionally, the SerDes interfaces 2c, 2d, 6a, and 6b consume relatively small amounts of power.

Addresses, commands and data to be written to the DRAM chips 3 and 4 are sent over the SerDes interfaces 6a/2c from the ASIC chip 6 to the memory controller chip 2. Data read from the DRAM chips 3 and 4 is sent over the SerDes interfaces 2d/6b from the memory controller chip 2 to the ASIC chip 6. The SerDes interfaces 6a/2c and 6b/2d are not limited to any particular SerDes configurations. As will be understood by persons of skill in the art, in view of the discussion provided herein, a variety of SerDes configurations are suitable for use with the invention. In the SerDes interface 6a, a parallel bit steam being clocked at a first clock frequency is converted into a serial bit stream. The serial bit stream is then clocked at a second clock frequency that is typically many times higher than the first clock frequency. In the SerDes interface 2c, the serial bit stream is converted into a parallel bit stream, which is clocked at a third clock frequency that is typically equal to the first clock frequency. Similarly, in the SerDes interface 2d, a parallel bit steam being clocked at the first clock frequency is converted into a serial bit stream. The serial bit stream is then clocked at the second clock frequency. In the SerDes interface 6b, the serial bit stream is converted into a parallel bit stream, which is clocked at the third clock frequency.

The physical connection between the SerDes interface 6a and the SerDes interface 2c is typically at least one differential pair connection, i.e., at least two data pins, D+ and D−, on the ASIC chip 6 that are electrically coupled to respective pins (not shown) on the memory controller chip 2 for transmitting two data signals that make up a differential pair. The clock signal corresponding to the second clock frequency may either be embedded in the differential data signals or provided on separate pins on the ASIC chip 6 and the memory controller chip 2. The physical connections between the SerDes interface 6b and the SerDes interface 2d may be the same as those described above for the SerDes interfaces 6a and 2c, respectively. In accordance with an illustrative, or exemplary, embodiment, sixteen differential pairs are used for each of the SerDes interfaces 2c/6a and 6b/2d at a serial clock frequency of 10 Gbps to provide a bandwidth in each direction of 16×10 Gbps=160 Gbps.

Figure 2:
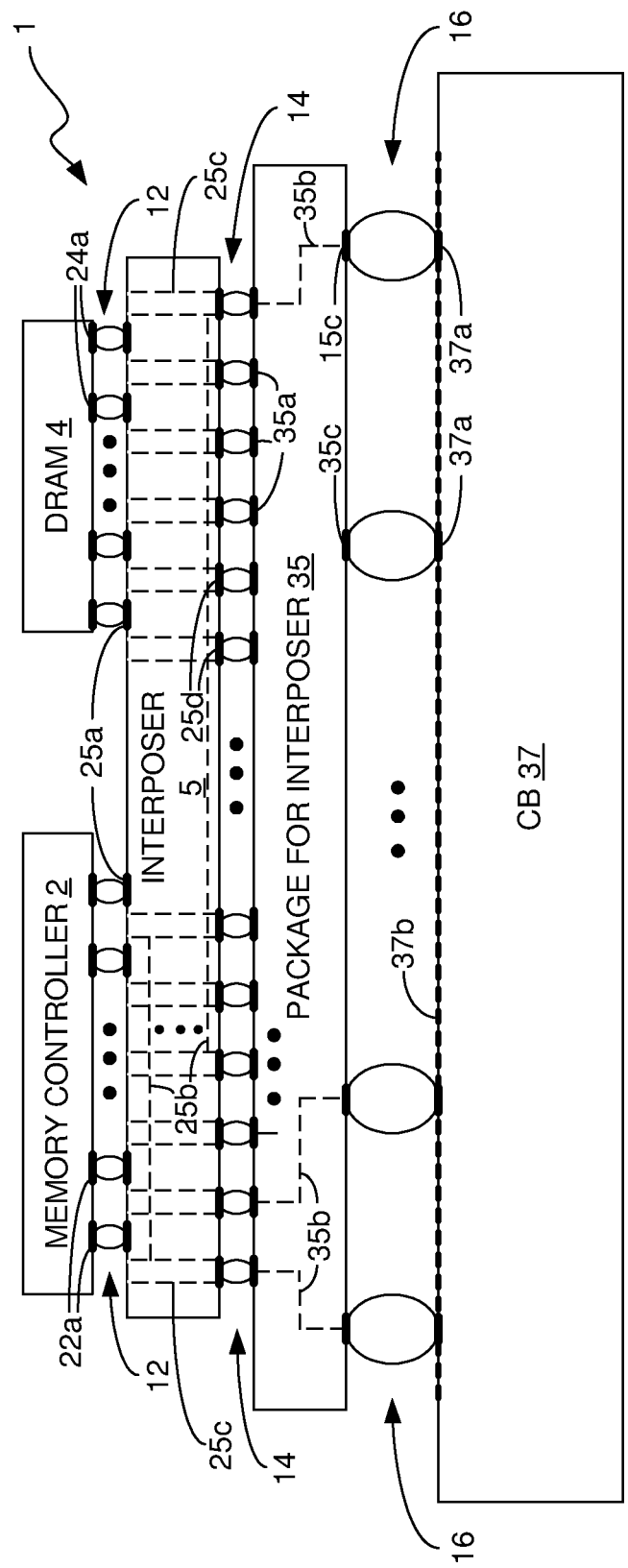
FIG. 2 illustrates a side cross-sectional view of the memory system shown in FIG. 1 mounted on a package, which is mounted on a circuit board.

FIG. 2 illustrates a cross-sectional view of the memory system 1 shown in FIG. 1 mounted on a package 35, which, in turn, is mounted on a circuit board (CB) 37. The CB 37 may be any type of CB, but is typically a printed circuit board (PCB). In the side cross-sectional view shown in FIG. 2, only one of the DRAM chips, DRAM chip 4, is visible. The IC chip 6 shown in FIG. 1 also is not visible in FIG. 2, although it is electrically coupled to the CB 37 and is typically also mounted on the CB 37. The memory controller chip 2 and the DRAM chips 3 and 4 have electrical contact pads 22a and 24a disposed on their lower surfaces that are electrically interconnected by electrically-conductive microbumps 12 to electrical contact pads 25a disposed on the upper surface of the interposer 5. The microbumps 12 have a very fine pitch to enable a very large number of interconnections to be made between the memory controller chip 2 and the interposer 5 and between the DRAM chips 3 and 4 and the interposer 5. The process by which microbumps 12 are placed with a very fine pitch is well known, and therefore will not be described in further detail herein in the interest of brevity.

The interposer 5 is a known device that is typically made of a silicon substrate and that has very fine-pitch electrical conductors extending on or in it in lateral directions and very fine pitch electrically-conductive through-silicon vias (TSVs) extending through it in vertical directions. For illustrative purposes, in FIG. 2, the electrical conductors that extend laterally through the interposer 5 and the vias that extend vertically through the interposer 5 are represented by dashed lines 25b and 25c, respectively. The bottom surface of the interposer 5 has electrical contact pads 25d disposed on it that are in contact with metallic microbumps 14. A package 35 for the interposer 5 has electrical contact pads 35a disposed on an upper surface thereof that are in contact with a leadframe 35b of the package 35. The leadframe 35b is also in contact with electrical contact pads 35c disposed on a lower surface of the package 35, which are in contact with respective electrically-conductive bumps 16 that are larger in size than the microbumps 12 and 14 and that have a coarser pitch than the microbumps 12 and 14. The coarser pitch of the bumps 16 makes the package 35 suitable for mounting on the CB 37.

The CB 37 has electrical contact pads 37a disposed on an upper surface thereof that are in contact with the coarser-pitch bumps 16. Through all of these interconnections, the electrical circuitry (not shown) of the CB 37 is electrically coupled with the electrical circuitry (not shown) of the memory controller chip 2 and with the electrical circuitry (not shown) of the DRAM chips 3 and 4.

The microbumps 12 and 14 typically have a diameter that ranges from about 25 to about 50 micrometers (microns) and are placed with a pitch that typically ranges from about 50 to about 100 microns. The invention, however, is not limited with respect to the pitch or diameter of the microbumps 12 and 14. The larger bumps 16 typically have a diameter that ranges from about 100 to 300 microns and a pitch that ranges from about 200 to about 600 microns. The invention, however, is not limited with respect to the pitch or diameter of the bumps 16.

As indicated above, the use of the interposer 5 allows a Wide I/O interface 3a (FIG. 1) and 4a (FIG. 1) between the DRAM chips 3 and 4, respectively, and the memory controller chip 2 (FIG. 1). In accordance with this illustrative embodiment, there are at least 512 electrically-conductive interconnections between each of the DRAM chips 3 and 4 and the memory controller chip 2. These interconnections are made through a combination of (1) the contact pads 24a and 22a disposed on the lower surfaces of the DRAM chips 3 and 4 and on the lower surface of the memory controller chip 2, respectively, (2) the microbumps 12, and (3) the contact pads 25a, the conductors 25b, and the TSVs 25c of the interposer 5.

As indicated above, pins (not shown) of the IC chip 6 are electrically coupled to pins (not shown) of the memory controller chip 2 to provide the SerDes interfaces 6a/2c (FIG. 1) and 6b/2d (FIG. 1). The electrical coupling of these pins is typically accomplished by electrically-conductive traces of the CB 37, which interconnect the pins of the IC chip 6 with the pins of the memory controller chip 2. The electrically-conductive traces of the CB 37 are represented in FIG. 2 by dashed line 37b. SerDes interfaces are well known, and therefore a detailed description of the configurations of the SerDes interfaces 6a/2c and 6b/2d will not be described herein in the interest of brevity.

Figure 3:
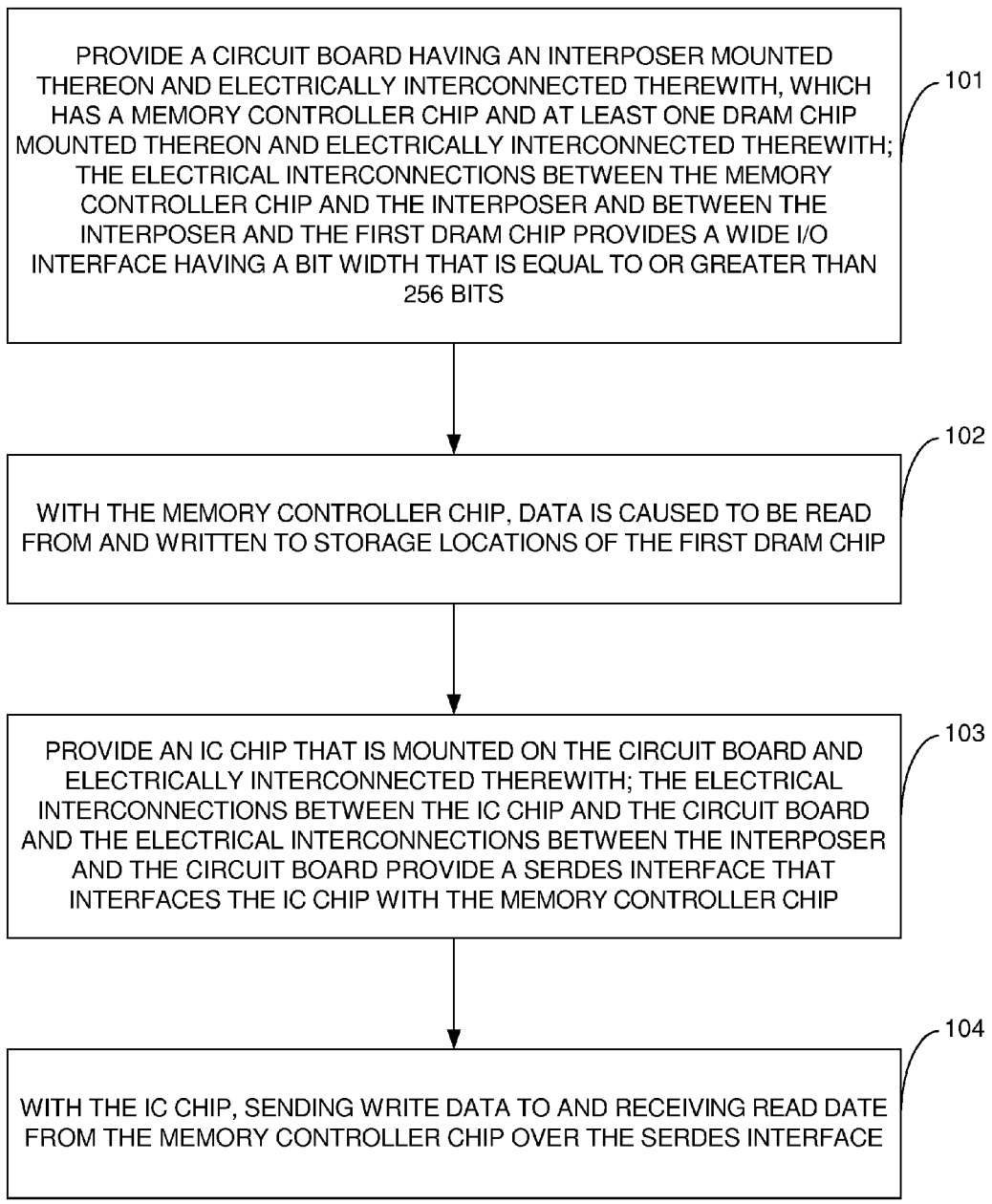
FIG. 3 illustrates a method of storing data in a memory system in accordance with an illustrative embodiment.

FIG. 3 illustrates a flowchart that represents the method in accordance with an illustrative embodiment. A circuit board is provided that has at least an interposer mounted thereon, which, in turn has at least a memory controller chip and a first DRAM chip mounted thereon, as indicated by block 101. The interposer is electrically interconnected with the circuit board. The memory controller chip and the first DRAM chip are electrically interconnected with the interposer. The electrical interconnections between the first DRAM chip and the interposer and between the memory controller chip and the interposer provide a first Wide I/O interface between the first DRAM chip and the memory controller chip. With the memory controller chip, data is caused to be written to and read from storage locations of the first DRAM chip, as indicated by block 102.

An IC chip is provided that is mounted on the circuit board and electrically interconnected with the circuit board, as indicated by block 103. The electrical interconnection of the IC chip with the circuit board and the electrical interconnection of the interposer with the circuit board provide a SerDes interface that interfaces the IC chip with the memory controller chip to allow these chips to communicate with each other via the SerDes interface. With the IC chip, write data is sent from the IC chip to the memory controller chip and read data is received in the IC chip from the memory controller chip, as indicated by block 104.

The embodiment described above with reference to FIGS. 1 and 2 is merely an example of a memory system configuration that achieves the goals and advantages of the invention. Many variations may be made to the configurations described above with reference to FIGS. 1 and 2 without deviating from the goals of the invention. For example, while two DRMA chips 3 and 4 are shown in FIG. 1, more than two DRAM chips and as few as one DRAM chip may be used in the memory system. As another example, the SerDes interfaces are not limited to any particular SerDes interface configuration. Those skilled in the art will understand the manner in which these and other variations may be made to the embodiments described above, and that all such variations are within the scope of the invention.

What is claimed is:
1. A memory system comprising:
a circuit board comprising a substrate having at least an upper surface and a lower surface;

a package mounted on the upper surface of the circuit board and electrically interconnected with the circuit board;

an interposer mounted on an upper surface of the package and electrically interconnected with the package;

at least a first dynamic random access memory (DRAM) chip mounted on an upper surface of the interposer and electrically interconnected with the interposer;

a memory controller chip mounted on the upper surface of the interposer and electrically interconnected with the interposer, wherein the memory controller chip and the first DRAM chip are electrically interconnected with each other via the interposer, and wherein the electrical interconnection between the first DRAM chip and the interposer and the electrical interconnection between the memory controller chip and the interposer provide a first Wide input/output (I/O) interface between the first DRAM chip and the memory controller chip, the first Wide I/O interface having a bit width that is equal to or greater than 256 bits;

an integrated circuit (IC) chip electrically interconnected with the circuit board; and a serializer/deserializer (SerDes) interface interfacing the IC chip with the memory controller chip to allow the IC chip and the memory controller chip to communicate with each other via the SerDes interface, the IC chip comprising a first portion of the SerDes interface and the memory controller chip comprising a second portion of the SerDes interface, and wherein the first and second portions of the SerDes interface are electrically coupled to each other via electrical conductors of the circuit board.

2. The memory system of claim 1, wherein the electrical interconnection between the circuit board and the interposer comprises a plurality of electrically-conductive bumps disposed in between the upper surface of the circuit board and a lower surface of the interposer, a plurality of electrically-conductive contact pad disposed on a lower surface of the interposer, and a plurality of electrically-conductive pads disposed on the upper surface of the circuit board, wherein the electrically-conductive bumps provide an electrical interconnection between the electrically conductive pads disposed on the lower surface of the interposer and the electrically-conductive contact pads disposed on the upper surface of the circuit board.

3. The memory system of claim 1, wherein the electrical interconnection between the interposer and the first DRAM chip comprises a plurality of electrically-conductive microbumps disposed in between the upper surface of the interposer and a lower surface of the first DRAM chip, a plurality of electrically-conductive contact pads disposed on an upper surface of the interposer, and a plurality of electrically-conductive pads disposed on the lower surface of the DRAM chip, wherein the electrically-conductive bumps provide an electrical interconnection between the electrically conductive pads disposed on the upper surface of the interposer and the electrically-conductive contact pads disposed on the lower surface of the first DRAM chip.

4. The memory system of claim 1, wherein the electrical interconnection between the interposer and the memory controller chip comprises a plurality of electrically-conductive microbumps disposed in between the upper surface of the interposer and a lower surface of the memory controller chip, a plurality of electrically-conductive contact pads disposed on the upper surface of the interposer, and a plurality of electrically-conductive pads disposed on a lower surface of the memory controller chip, wherein the electrically-conductive microbumps disposed in between the upper surface of the interposer and a lower surface of the memory controller chip provide an electrical interconnection between the electrically conductive pads disposed on the upper surface of the interposer and the electrically-conductive contact pads disposed on the lower surface of the memory controller chip.

5. The memory system of claim 1, further comprising:

at least a second DRAM chip mounted on the upper surface of the interposer and electrically interconnected with the interposer, wherein the memory controller chip and the second DRAM chip are electrically interconnected with each other via the interposer, and wherein the electrical interconnection between the second DRAM chip and the interposer and the electrical interconnection between the memory controller chip and the interposer provide a second Wide I/O interface between the second DRAM chip and the memory controller chip, the second Wide I/O interface having a bit width that is equal to or greater than 256 bits.

6. The memory system of claim 5, wherein the electrical interconnection between the interposer and the second DRAM chip comprises a plurality of electrically-conductive microbumps disposed in between the upper surface of the interposer and a lower surface of the second DRAM chip, a plurality of electrically-conductive contact pads disposed on the upper surface of the interposer, and a plurality of electrically-conductive pads disposed on the lower surface of the second DRAM chip, wherein the electrically-conductive microbumps provide an electrical interconnection between the electrically conductive pads disposed on the upper surface of the interposer and the electrically-conductive contact pads disposed on the lower surface of the second DRAM chip.

7. The memory system of claim 5, wherein the first and second Wide I/O interfaces each have a bit width that is equal to or greater than 512 bits.

8. The memory system of claim 7, wherein the first and second Wide I/O interfaces operate at a clock rate of at least 200 megabits per second (Mbps) to provide a shared read/write bandwidth of at least about 204.8 gigabits per second (Gbps).

9. The memory system of claim 5, wherein the first and second Wide I/O interfaces each have a bit width that is equal to or less than 512 bits.

10. The memory system of claim 5, wherein the first and second Wide I/O interfaces comply with a Joint Electron Devices Engineering Council (JEDEC) Wide I/O interface standard JC-42.6.

11. The memory system of claim 1, wherein the first portion of the SerDes interface includes a first transmit portion and a first receive portion, and wherein the second portion of the SerDes interface includes a second transmit portion and a second receive portion, and wherein the first transmit portion is electrically coupled with the second receive portion, and wherein the first receive portion is electrically coupled with the second transmit portion.

12. The memory system of claim 11, wherein the first portion of the SerDes interface communicates sixteen differential pairs at a speed of approximately ten Gigabits per second (Gbps) to achieve a bandwidth of about 160 Gbps between the first transmit portion and the second receive portion, and wherein the second portion of the SerDes interface communicates sixteen differential pairs at a speed of approximately ten Gbps to achieve a bandwidth of about 160 Gbps between the second transmit portion and the first receive portion.

13. The memory system of claim 12, wherein the IC chip is an application specific integrated circuit (ASIC).

14. A method of accessing a memory system to read data from and write data to storage locations of the memory system, the method comprising:
    providing a circuit board having an interposer mounted thereon, a lower surface of the interposer being adjacent an upper surface of the circuit board, the interposer and the circuit board being electrically interconnected, wherein at least a first dynamic random access memory (DRAM) chip and a memory controller chip are mounted on the upper surface of the interposer and are electrically interconnected with the interposer, wherein the memory controller chip and the first DRAM chip are electrically interconnected with each other via the interposer, and wherein the electrical interconnection between the first DRAM chip and the interposer and the electrical interconnection between the memory controller chip and the interposer provide a first Wide input/output (I/O) interface between the first DRAM chip and the memory controller chip, the first Wide I/O interface having a bit width that is equal to or greater than 256 bits;
    with the memory controller chip, causing data to be read from and written to storage locations of the first DRAM chip via the first Wide I/O interface;
    providing an integrated circuit (IC) chip that is electrically interconnected with the circuit board, and wherein the electrical interconnection of the IC chip with the circuit board and the electrical interconnection of the interposer with the circuit board provides a serializer/deserializer (SerDes) interface that interfaces the IC chip with the memory controller chip to allow the IC chip and the memory controller chip to communicate with each other via the SerDes interface; and
    with the IC chip, sending write data to the memory controller chip and receiving read data from the memory controller chip via the SerDes interface.

15. The method of claim 14, wherein the electrical interconnection between the circuit board and the interposer comprises a plurality of electrically-conductive bumps disposed in between the upper surface of the circuit board and a lower surface of the interposer, a plurality of electrically-conductive contact pad disposed on a lower surface of the interposer, and a plurality of electrically-conductive pads disposed on the upper surface of the circuit board, wherein the electrically-conductive bumps provide an electrical interconnection between the electrically conductive pads disposed on the lower surface of the interposer and the electrically-conductive contact pads disposed on the upper surface of the circuit board.

16. The method of claim 14, wherein the electrical interconnection between the interposer and the first DRAM chip comprises a plurality of electrically-conductive microbumps disposed in between the upper surface of the interposer and a lower surface of the first DRAM chip, a plurality of electrically-conductive contact pads disposed on an upper surface of the interposer, and a plurality of electrically-conductive pads disposed on the lower surface of the DRAM chip, wherein the electrically-conductive bumps provide an electrical interconnection between the electrically conductive pads disposed on the upper surface of the interposer and the electrically-conductive contact pads disposed on the lower surface of the first DRAM chip.

17. The method of claim 14, wherein the electrical interconnection between the interposer and the memory controller chip comprises a plurality of electrically-conductive microbumps disposed in between the upper surface of the interposer and a lower surface of the memory controller chip, a plurality of electrically-conductive contact pads disposed on the upper surface of the interposer, and a plurality of electrically-conductive pads disposed on a lower surface of the memory controller chip, wherein the electrically-conductive microbumps disposed in between the upper surface of the interposer and a lower surface of the memory controller chip provide an electrical interconnection between the electrically conductive pads disposed on the upper surface of the interposer and the electrically-conductive contact pads disposed on the lower surface of the memory controller chip.

18. The method of claim 17, wherein at least a second DRAM chip is mounted on the upper surface of the interposer and electrically interconnected to the interposer, and wherein the electrical interconnection between the second DRAM chip and the interposer and the electrical interconnection between the memory controller chip and the interposer provide a second Wide I/O interface between the second DRAM chip and the memory controller chip, the second Wide I/O interface having a bit width that is equal to or greater than 256 bits, the method further comprising:
    with the memory controller chip, causing data to be read from and written to storage locations of the second DRAM chip via the second Wide I/O interface.

19. The method of claim 18, wherein the electrical interconnection between the interposer and the second DRAM chip comprises a plurality of electrically-conductive microbumps disposed in between the upper surface of the interposer and a lower surface of the second DRAM chip, a plurality of electrically-conductive contact pads disposed on the upper surface of the interposer, and a plurality of electrically-conductive pads disposed on the lower surface of the second DRAM chip, wherein the electrically-conductive microbumps provide an electrical interconnection between the electrically conductive pads disposed on the upper surface of the interposer and the electrically-conductive contact pads disposed on the lower surface of the second DRAM chip.

20. The method of claim 18, wherein the first and second Wide I/O interfaces each have a bit width that is equal to or greater than 512 bits.

21. The method of claim 20, wherein the first and second Wide I/O interfaces operate at a clock rate of at least 200 megabits per second (Mbps) to provide a shared read/write bandwidth of at least about 204.8 gigabits per second (Gbps).

22. The method of claim 21, wherein the SerDes interface comprises at least sixteen differential pairs for sending write data and commands from the IC chip to the memory controller chip and at least sixteen differential pairs for sending read data from the memory controller chip to the IC chip, and wherein each differential pair operates at a speed of at least about 10 Gigabits per second (Gbps) to achieve a total bandwidth of about 160 Gbps.

23. The method of claim 22, wherein the IC chip is an application specific integrated circuit (ASIC).

24. The method of claim 18, wherein the first and second Wide I/O interfaces each have a bit width that is equal to or less than 512 bits.

25. The method of claim 18, wherein the first and second Wide I/O interfaces comply with a Joint Electron Devices Engineering Council (JEDEC) Wide I/O interface standard JC-42.6.

* * * * *